United States Patent
Nagai et al.

(10) Patent No.: US 10,026,918 B2
(45) Date of Patent: Jul. 17, 2018

(54) WHITE LIGHT EMITTING ORGANIC EL PANEL AND METHOD FOR PRODUCING SAME

(71) Applicant: KANEKA CORPORATION, Osaka-shi, Osaka (JP)

(72) Inventors: Naomi Nagai, Otsu (JP); Hirotaka Umezaki, Kamikita-gun (JP)

(73) Assignee: Kaneka Corporation, Osaka-shi, Osaka (JP)

( * ) Notice: Subject to any disclaimer, the term of this patent is extended or adjusted under 35 U.S.C. 154(b) by 0 days.

(21) Appl. No.: 15/506,387

(22) PCT Filed: May 24, 2016

(86) PCT No.: PCT/JP2016/065355
§ 371 (c)(1),
(2) Date: Feb. 24, 2017

(87) PCT Pub. No.: WO2017/006639
PCT Pub. Date: Jan. 12, 2017

(65) Prior Publication Data
US 2017/0324056 A1    Nov. 9, 2017

(30) Foreign Application Priority Data
Jul. 8, 2015 (JP) .................. 2015-137272

(51) Int. Cl.
*H01L 51/50* (2006.01)
*H01L 51/52* (2006.01)
(Continued)

(52) U.S. Cl.
CPC ........ *H01L 51/5044* (2013.01); *H01L 51/001* (2013.01); *H01L 51/0096* (2013.01);
(Continued)

(58) Field of Classification Search
CPC .............. H01L 51/001; H01L 51/0096; H01L 51/5004; H01L 51/5016; H01L 51/5044;
(Continued)

(56) References Cited

U.S. PATENT DOCUMENTS

| | | |
|---|---|---|
| 9,105,857 B2 | 8/2015 | Kubota et al. |
| 2006/0099447 A1 | 5/2006 | Lee et al. |

(Continued)

FOREIGN PATENT DOCUMENTS

| | | |
|---|---|---|
| JP | 2006135295 A | 5/2006 |
| JP | 2006172762 A | 6/2006 |

(Continued)

OTHER PUBLICATIONS

European Patent Office, Supplementary European Search Report Issued in European Application No. 16821110, Aug. 17, 2017, The Hague, Netherlands, 2 pages.

(Continued)

*Primary Examiner* — Allan R Wilson
(74) *Attorney, Agent, or Firm* — Alleman Hall Creasman & Tuttle LLP (57) ABSTRACT

A white light-emitting organic EL panel is high in color rendering properties and is excellent in hue stability. The panel includes a light-emitting functional layer that has a blue light anode side unit, a connection layer, and a red-green light cathode side unit. The connection layer injects electrons into the blue light anode side and injects holes into the red-green light cathode side when current is applied. The red-green light cathode side unit includes a red-green phosphorescent light-emitting layer composed of a red phosphorescent material, a green phosphorescent material, and a host material for the phosphorescent light-emitting layer. The maximum emission peak wavelength of the red and green phosphorescent materials are 60 nm or more apart, and the (Continued)

panel is capable of emitting white light with a general color rendering index and a special color rendering index greater than or equal to 90.

15 Claims, 5 Drawing Sheets

(51) Int. Cl.
*H01L 51/00* (2006.01)
*H01L 51/56* (2006.01)

(52) U.S. Cl.
CPC ...... *H01L 51/5004* (2013.01); *H01L 51/5016* (2013.01); *H01L 51/524* (2013.01); *H01L 51/5206* (2013.01); *H01L 51/5221* (2013.01); *H01L 51/56* (2013.01); *H01L 2251/552* (2013.01); *H01L 2251/556* (2013.01)

(58) Field of Classification Search
CPC ............. H01L 51/5206; H01L 51/5221; H01L 51/524; H01L 51/56
See application file for complete search history.

(56) References Cited

U.S. PATENT DOCUMENTS

| | | |
|---|---|---|
| 2006/0158104 A1 | 7/2006 | Iijima et al. |
| 2007/0035238 A1 | 2/2007 | Nakagawa et al. |
| 2007/0099026 A1* | 5/2007 | Lee ................. H01L 51/504 428/690 |
| 2010/0140645 A1 | 6/2010 | Shibata |
| 2011/0248249 A1* | 10/2011 | Forrest ............... H01L 51/5016 257/40 |
| 2011/0284831 A1 | 11/2011 | Kaiser et al. |
| 2014/0009918 A1* | 1/2014 | Kubota ............... H01L 51/5044 362/154 |
| 2014/0016308 A1 | 1/2014 | Kubota et al. |
| 2015/0155511 A1 | 6/2015 | Ohsawa et al. |
| 2015/0155514 A1 | 6/2015 | Kaiser et al. |
| 2015/0207091 A1 | 7/2015 | Morimoto et al. |
| 2017/0069863 A1* | 3/2017 | Kato ................... H05B 33/14 |
| 2017/0200911 A1* | 7/2017 | Morimoto .......... H01L 51/5044 |

FOREIGN PATENT DOCUMENTS

| | | |
|---|---|---|
| JP | 2010161071 A | 7/2010 |
| JP | 2012519944 A | 8/2012 |
| JP | 2014011208 A | 1/2014 |
| JP | 5735162 B1 | 6/2015 |
| KR | 20110065062 A | 6/2011 |
| WO | 2010102706 A1 | 9/2010 |
| WO | 2012128117 A1 | 9/2012 |
| WO | 2014002927 A1 | 1/2014 |
| WO | 2015151684 A1 | 10/2015 |

OTHER PUBLICATIONS

Liao, L. et al., "Tandem Organic Light-Emitting Diode using Hexaazatriphenylene Hexacarbonitrile in the Intermediate connector," Advanced Materials, vol. 20, No. 2, Jan. 2008, Published Online Dec. 20, 2007, 6 pages.

ISA Japan Patent Office, International Search Report Issued in Application No. PCT/JP2016/065355, dated Jul. 19, 2016. WIPO, 4 pages.

ISA Japan Patent Office, Written Opinion Issued in Application No. PCT/JP2016/065355, dated Jul. 19, 2016, WIPO, 10 pages.

* cited by examiner

WHITE LIGHT EMITTING ORGANIC EL PANEL AND METHOD FOR PRODUCING SAME

TECHNICAL FIELD

The present invention relates to a white light-emitting organic EL panel and a production method thereof. In particular, the present invention relates to a white light-emitting organic EL panel which is capable of illuminating an object to be illuminated so as to reproduce a natural hue thereof and is excellent in color rendering properties, and a production method therefor.

BACKGROUND ART

An organic EL element is a semiconductor element that converts electric energy into light energy.

In recent years, researches on an organic EL element which is attempted to be applied particularly to a display screen of a mobile phone or a portable display device have been actively conducted. Moreover, improvements have been made to organic materials constituting the organic EL element and the like, and as a result, the drive voltage of the organic EL element has been remarkably lowered and the luminous efficiency has been heightened. From this, an organic EL panel in which an organic EL element highly increased in luminance and highly enhanced in efficiency is adopted as an illumination panel has been put into practical use and has begun to be sold in the market.

In the case of using an organic EL panel as an illumination device, the organic EL panel is required to have high luminance and high luminous efficiency. In order to attain high luminance, it is necessary to make the applied current large and to make the current density per light-emitting area large. However, although the current density per light-emitting area applied to an organic EL panel can be made large to attain high luminance, in contrast thereto, there is a problem that a load is applied to an organic EL element built in the organic EL panel and the life of the organic EL element is liable to be shortened. On that account, Non-Patent Document 1 discloses a lamination type organic EL element including a charge generating layer as an improvement method therefor.

Incidentally, in recent years, with regard to a next-generation illumination panel, the technological development of a method for imparting a panel with high color rendering properties at various color temperatures has been actively conducted.

However, in the current situation of the white light-emitting organic EL panel, sufficiently high color rendering properties have not yet been realized as compared with a conventional fluorescent light. Particularly, in the case where an organic EL panel is made to have a luminance adjusting function and the current density is changed to make the organic EL panel variable in luminance, the color temperature is difficult to be maintained constant due to a change in current density at the time of changing the luminance. As such, in order to realize a white light-emitting organic EL panel having both high stability and high color rendering properties, some challenges still remain to be done.

In this context, with regard to a white light source with three primary colors of red/green/blue, it is advantageous for an increase in luminance and an enhancement in efficiency to heighten the emission intensity of green color with a large luminosity factor. As such, in a conventional panel, it is common for the maximum emission position (hereinafter, also referred to as peak wavelength) of the emission spectrum of green color and the peak wavelength of the emission spectrum of red color to be closely arranged so that the emission spectra of green color and red color are overlapped.

However, in such a structure, the luminance can be enhanced, but the general color rendering index Ra is not more than 80 or so and there has been a limit to the reproducibility of a natural hue of an object to be illuminated. Particularly, in the conventional panel, there has been a problem that the special color rendering index R9 remains 20 to 30 or so and red color fails to be vividly reproduced.

Moreover, when the peak wavelength of a green color phosphorescent light-emitting layer is arranged close to the peak wavelength of a red color phosphorescent light-emitting layer, the emission spectrum of the green color phosphorescent light-emitting layer is made to shift to the red side and reddish green color is emitted from the green color phosphorescent light-emitting layer. That is, when the red shift occurs at the green color phosphorescent light-emitting layer, it is disadvantageous for an enhancement in efficiency and there is also a problem that the phosphorescence luminescent material, which is relatively expensive, is wastefully consumed.

On that account, in Patent Document 1, there has been proposed an organic electroluminescent element having two maximum emission wavelengths in the emission spectrum of blue color ranging from 440 to 490 nm, one maximum emission wavelength in the emission spectrum of green color ranging from 500 to 540 nm and one maximum emission wavelength in the emission spectrum of red color ranging from 600 to 640 nm, wherein the maximum emission wavelength of green color and the maximum emission wavelength of blue color are arranged so as to have a certain distance or more therebetween and the maximum emission wavelength of green color and the maximum emission wavelength of red color are arranged so as to have a predetermined distance or more therebetween. According to the element of the Patent Document 1, without making the red shift occur, the general color rendering index Ra higher than that of the conventional panel is attained.

PRIOR ART DOCUMENTS

Patent Document

Patent Document 1: JP 2014-011208 A

Non-Patent Document

Non-Patent Document 1: Liang-Sheng Liao et al., Adv. Mater. 2008, 20, 324-329

DISCLOSURE OF INVENTION

Technical Problem

In the element of the Patent Document 1, since a red color phosphorescent light-emitting layer is provided adjacent to a green color phosphorescent light-emitting layer without a connection layer interposed therebetween, the position of the emission interface as the reaction field in the green color phosphorescent light-emitting layer and the red color phosphorescent light-emitting layer depends on the moving speed of electrons and holes. As such, when the current density is changed, the moving speed of electrons and holes is changed and the position of the emission interface where electrons and holes react with each other varies and is not stabilized. Therefore, in the element described in Patent Document 1, with regard to the color temperature and color rendering properties, the temperature dependency and the current density dependency become large and there is a problem that the hue of a product is not stabilized. Particularly, in the case where the element described in Patent Document 1 is made variable in luminance at a prescribed color temperature, since the temperature generated during the light emission and the density of a current vary with the luminance, there is also a problem that the performance guarantee range therefor is difficult to be sufficiently widely secured.

On that account, the present invention aims at providing a white light-emitting organic EL panel which is high in color rendering properties and is excellent in hue stability of a basic product prepared therewith and a production method therefor.

Solution to Problem

In view of such problems, the present inventors thought that a red color phosphorescent material constituting a red phosphorescent light-emitting layer and a green color phosphorescent material constituting a green phosphorescent light-emitting layer are subjected to co-vapor deposition to prepare a composite layer so that red light and green light in specific proportions are emitted even in the case where the emission interface is arranged in any position, and a green color phosphorescent light-emitting material can be made to shift to the red side intentionally. Since the green color phosphorescent material is thus made to shift to the red side stably and the emission color is stabilized because the ratio of the red emission and the green emission becomes constant even when the emission interface as the reaction field is arranged in any position, the present inventors have found that the color rendering properties and the stability of a basic product hue can be secured.

According to an aspect of the present invention derived from such findings, there is provided a white light-emitting organic EL panel including an organic EL element that includes: an anode layer; a cathode layer; and a light-emitting functional layer between the anode layer and the cathode layer, the light-emitting functional layer including in order from the anode layer toward the cathode layer: an anode side blue light-emitting unit; a connection layer; and a cathode side red-green (red and green) light-emitting unit, the connection layer injecting electrons into the anode side blue light-emitting unit and injecting holes into the cathode side red-green light-emitting unit when current is applied, the cathode side red-green light-emitting unit including a red-green phosphorescent light-emitting layer that is a composite layer including: a red color phosphorescent material; a green color phosphorescent material; and a host material for the phosphorescent light-emitting layer, wherein maximum emission peak wavelength of the red color phosphorescent material is apart from maximum emission peak wavelength of the green color phosphorescent material by 60 nm or more, and wherein the white light-emitting organic EL panel is capable of emitting white light with an general color rendering index Ra and a special color rendering index R9 in accordance with JIS Z 8726, both of the Ra and the R9 being greater than or equal to 90.

This so-called "red color phosphorescent material" refers to a luminescent material exhibiting red color phosphorescent light emission.

This so-called "green color phosphorescent material" refers to a luminescent material exhibiting green color phosphorescent light emission.

According to this aspect, since the cathode side red-green light-emitting unit is provided with a red-green phosphorescent light-emitting layer as a composite layer in which a red color phosphorescent material and a green color phosphorescent material are combined with a host material for the phosphorescent light-emitting layer, in the red-green phosphorescent light-emitting layer, the red shift attributed to the green color phosphorescent material can be made to stably occur. As such, the ratio of the green emission and the red emission is kept constant independently of the temperature of the organic EL element and the current density, and a widely ranging emission spectrum from deep crimson can be obtained. Therefore, the panel is high in color rendering properties and is excellent in stability of color temperature and stability of basic color rendering properties.

In a preferred aspect thereof, the organic EL element is laminated on a substrate, and the white light-emitting organic EL panel further includes a sealing film that seals the organic EL element between the sealing film and the substrate, the sealing film including an inorganic sealing layer in contact with the organic EL element.

According to this aspect, since the stability effect is sufficiently exerted and the panel is usable in a wide luminance range, the panel can realize high reliability, thus hardly causing a problem such as the occurrence of lighting failure.

In a preferred aspect thereof, the white light has a rated color temperature within a range of 500 K or lower, and at the rated color temperature, the white light-emitting organic EL panel is capable of being set to at least a first rated luminance value and a second rated luminance value, the two rated luminance values being allocated so as to have 2000 cd/m$^2$ in between, the second rated luminance value being greater than or equal to 2 times of the first rated luminance value.

According to this aspect, since the panel is made to have a plurality of rated luminance values at a rated color temperature, the brightness is easily adjusted. Moreover, according to this aspect, even in such a case of being variable in luminance, it is possible to secure a sufficiently wide performance guarantee range therefor.

In a preferred aspect thereof, the host material for the phosphorescent light-emitting layer has an energy gap ΔE between $E_{LUMO}$ and $E_{HOMO}$ greater than or equal to 2.5 eV and less than or equal to 3.5 eV.

According to this aspect, the panel is further increased in stability of the red shift attributed to the green color phosphorescent material. Based on the green phosphorescence excellent in such a basic stability, the possibility that red phosphorescence is caused only by the red shift is heightened. With this setup, since the stability of the ratio of the green emission and the red emission is further enhanced, the panel becomes smaller in temperature dependency and current density dependency. That is, according to this aspect, red phosphorescence can be made to stably occur by virtue of the green color phosphorescent material, and this enables the luminescent color to be hardly affected by the temperature and the like.

In a preferred aspect thereof, the red-green phosphorescent light-emitting layer includes: the red color phosphorescent material in an amount greater than or equal to 0.01 mass % and less than or equal to 0.3 mass %; and the green color phosphorescent material in an amount greater than or equal to 100 times and less than 300 times of the red color phosphorescent material.

That is, when the content of the red color phosphorescent material in the red-green phosphorescent light-emitting layer is defined as X mass % and the content of the green color phosphorescent material therein is defined as α×X mass %, it is preferred that X be greater than or equal to 0.01 and less than 0.3 and α be greater than or equal to 100 and less than 300.

According to these aspects, the content of the red color phosphorescent material in the red-green phosphorescent light-emitting layer is small, and the content of the green color phosphorescent material in the red-green phosphorescent light-emitting layer is significantly larger than the content of the red color phosphorescent material. As such, the occurrence degree of red phosphorescence by only the red shift attributed to green phosphorescence is further heightened. Therefore, the panel can be made to become smaller in temperature dependency and current density dependency.

In a preferred aspect thereof, an emission spectrum of the white light has an emission peak within the range of 500 nm to 580 nm and another emission peak within the range of 590 nm to 630 nm.

According to this aspect, by a relatively simple configuration, white light with an general color rendering index Ra value and a special color rendering index R9 value serving as indexes of color rendering properties, both of which are greater than or equal to 90, is easily obtained. Moreover, according to this aspect, red phosphorescence by substantially only the red shift of the green color phosphorescent material is made to easily occur. That is, according to this aspect, based on an increase in red monochromatic light-emission by red shift, the stability of a product hue can be further enhanced.

In a preferred aspect thereof, a coordinate position of the white light in CIE 1931 chromaticity coordinate system is at a distance less than or equal to 0.005 from a black-body radiation curve.

According to this aspect, the reproducibility of a natural hue of an object to be illuminated can be further enhanced. That is, according to this aspect, the panel is made to have more enhanced hue reproducibility.

In a preferred aspect thereof, the color temperature of the white light is higher than or equal to 3000 K and lower than or equal to 5000 K, and the white light has an emission peak within a range of 455 nm or more and 470 nm or less as its spectrum, the emission peak having a half-value width greater than or equal to 50 nm.

According to this aspect, with regard to the blue emission, the panel is made to have a more enhanced reproducibility of a natural hue of an object to be illuminated.

In a preferred aspect thereof, an area on which the red emission spectrum of the red color phosphorescent material and the green emission spectrum of the green color phosphorescent material overlap is less than or equal to 60% of an area of the red emission spectrum.

According to this aspect, the panel is made to become high in red monochromatic light-emission by red shift and can be made to have a more enhanced reproducibility of a natural hue of an object to be illuminated.

In a preferred aspect thereof, the organic EL element is laminated on a translucent insulation substrate, and the panel is capable of emitting the white light from a side of the translucent insulation substrate.

There is provided a production method for a white light-emitting organic EL panel in the above-mentioned aspect, including the step of comprising the step of performing co-vapor deposition of the red color phosphorescent material, the green color phosphorescent material, and the host material for the phosphorescent light-emitting layer to form the red-green phosphorescent light-emitting layer.

According to this aspect, the red-green phosphorescent light-emitting layer can be formed by one process and is easily produced.

Effect of Invention

According to the present invention, the panel is made to become high in both the general color rendering index Ra and the special color rendering index R9 for red color and is made to become excellent in the stability of color temperature and color rendering properties.

BEST MODE FOR CARRYING OUT THE INVENTION

Hereinafter, a embodiment according to the present invention will be described in detail.

(White Light-emitting Organic EL Panel 100)

Figure 1:
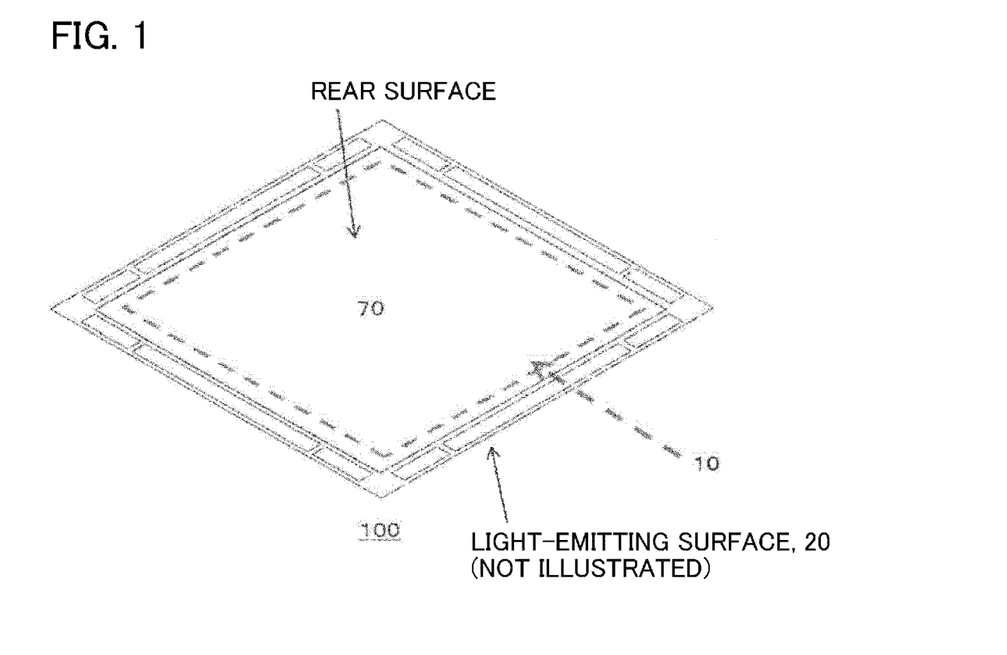
FIG. 1 is a perspective view showing a white light-emitting organic EL panel 100 in accordance with one embodiment of the present invention.

Hereinafter, a white light-emitting organic EL panel 100 of the present invention will be described with reference to FIG. 1. That is, FIG. 1 is a perspective view showing the white light-emitting organic EL panel 100 in accordance with one embodiment of the present invention.

The white light-emitting organic EL panel 100 has a light-emitting surface and a rear surface as both main surfaces. The white light-emitting organic EL panel 100 has a built-in organic EL element 10 and emits white light from a light-emitting region 20 at the light-emitting surface side based on the light emission of the organic EL element 10. The white light-emitting organic EL panel 100 is a member in a planarly spread state, and specifically, is a plate-like panel.

First, prior to the description for the respective constituent elements constituting the white light-emitting organic EL panel 100, physical properties of white light capable of being emitted from the white light-emitting organic EL panel 100 will be described. In this connection, in the case where the panel of the present invention is provided with a light extraction layer 7 described below like the white light-emitting organic EL panel 100 in accordance with the present embodiment, measured values are values obtained when white light transmitted through the light extraction layer 7 is measured for the color rendering properties, the spectrum, and the color temperature.

The white light-emitting organic EL panel 100 emits specific white light attributed to the organic EL element 10 from the light-emitting surface. Both of the general color rendering index Ra and the special color rendering index R9 of white light emitted from this white light-emitting organic EL panel 100 in accordance with JIS Z 8726 are greater than or equal to 90.

Moreover, with regard to the white light-emitting organic EL panel 100, the amount of change in the color temperature or the color rendering properties with a change in the current density or the element temperature of the organic EL element 10 caused mainly by the change of luminance is small, and the panel has a stability.

It is preferred that the white light-emitting organic EL panel 100 be made to have a plurality of rated luminance values having a rated color temperature within a prescribed color temperature range. That is, it is preferred that the white light-emitting organic EL panel 100 be used as an illumination panel variable in luminance. The rated luminance of the white light-emitting organic EL panel 100 of the present embodiment is capable of being set to a value among two or more rated luminance values L1, L2 and the like at a rated color temperature within a prescribed color temperature range by changing the current density and the like.

In the case where, like the white light-emitting organic EL panel 100 of the present embodiment, a rated color temperature within a prescribed color temperature range is secured and at least two rated luminance values L1, L2 and the like, which are different from one another in luminance, exist, it is preferred that one rated luminance value L1 be greater than or equal to 2000 cd/m$^2$ and the other rated luminance value L2 be less than or equal to 2000 cd/m$^2$. Furthermore, it is preferred that these two rated luminance values L1 and L2 be two values, between which a value of 2000 cd/m$^2$ is interposed, of a smaller value and a larger value having an intensity greater than or equal to 2 times the intensity of the smaller value as the difference. That is, it is preferred that the rated luminance values L1 and L2 satisfy the relationship of (L1−L2)≥L2×2.

With regard to the two rated luminance values L1 and L2, it is preferred that a rated color temperature within the color temperature range of 500 K or lower be secured, and it is more preferred that a rated color temperature within the color temperature range of 200 K or lower be secured.

With regard to the luminance range within which the two rated luminance values L1 and L2 are included, the range of 0.5 cd/m$^2$ to 20000 cd/m$^2$ is preferred, the range of 1 cd/m$^2$ to 10000 cd/m$^2$ is more preferred and the range of 10 cd/m$^2$ to 5000 cd/m$^2$ is further preferred.

The rated color temperature is higher than or equal to 1000 K and lower than or equal to 10000 K and is preferably higher than or equal to 3000 K and lower than or equal to 6000 K. As mentioned above, the white light-emitting organic EL panel 100 of the present embodiment has two or more rated luminance values L1, L2 and the like. And then, with regard to the white light-emitting organic EL panel 100 of the present embodiment, among these two rated luminance values L1 and L2, one rated luminance value L1 is greater than or equal to 2000 cd/m$^2$ and less than or equal to 20000 cd/m$^2$ and the other rated luminance value L2 is greater than or equal to 0.5 cd/m$^2$ and less than 2000 cd/m$^2$.

Figure 3:
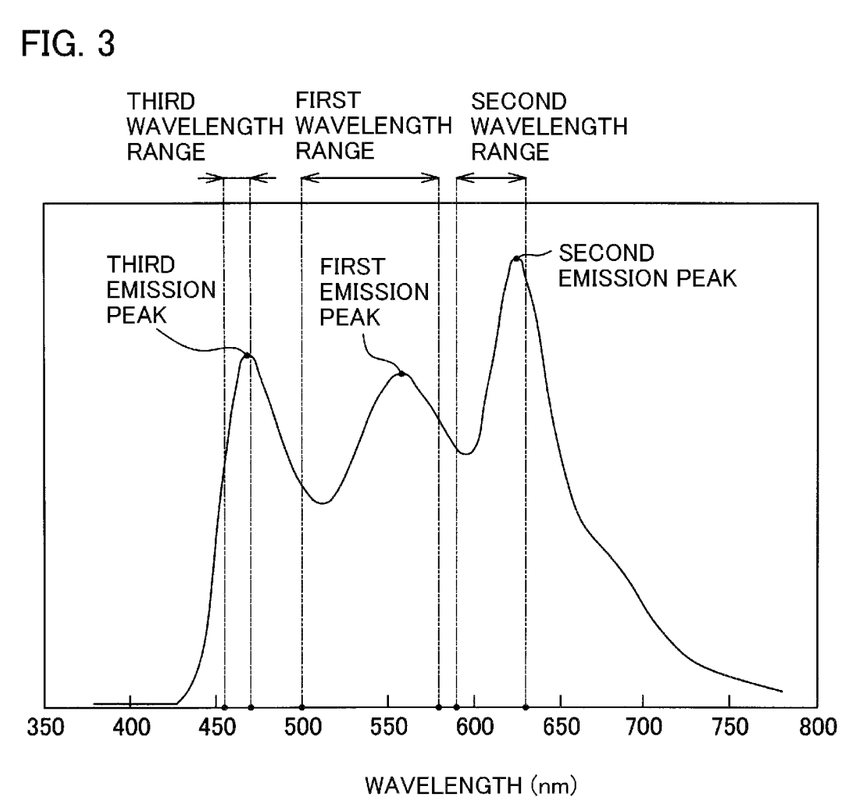
FIG. 3 is an explanatory diagram showing an emission spectrum of white light emitted from a white light-emitting organic EL panel 100 of the present invention.

With regard to white light emitted from the white light-emitting organic EL panel 100, as shown in FIG. 3, the emission spectrum thereof has at least two emission peaks, and it is preferred that the emission spectrum thereof have a first emission peak within a wavelength range (first wavelength range) of 500 nm or more and 580 nm or less and a second emission peak within a wavelength range (second wavelength range) of 590 nm or more and 630 nm or less.

With regard to white light emitted from the white light-emitting organic EL panel 100, furthermore, it is more preferred that the emission spectrum thereof have a third emission peak within a wavelength range (third wavelength range) of 455 nm or more and 470 nm or less, and it is further preferred that the half-value width of the third emission peak be greater than or equal to 50 nm.

With regard to emitted light from the white light-emitting organic EL panel 100 of the present embodiment, as shown in FIG. 3, the emission spectrum thereof has three emission peaks, and three peak wavelengths corresponding to the emission peaks lie within a wavelength range of 455 nm or more and 470 nm or less, a wavelength range of 500 nm or more and 580 nm or less and a wavelength range of 590 nm or more and 630 nm or less, respectively.

Moreover, with regard to white light emitted from the white light-emitting organic EL panel 100, it is preferred that the coordinate position in the CIE 1931 chromaticity coordinate system be at a distance less than or equal to 0.005 from a black-body radiation curve. That is, with regard to white light emitted from the white light-emitting organic EL panel 100, it is preferred that the deviation duv from a black-body locus be less than or equal to 0.005.

With regard to white light emitted from the white light-emitting organic EL panel 100, it is preferred that the color temperature thereof be higher than or equal to 3000 K and lower than or equal to 5000 K, and it is further preferred that the color temperature thereof be higher than or equal to 4000 K.

Subsequently, the respective constituent elements of the white light-emitting organic EL panel 100 in accordance with one embodiment of the present invention will be described.

The white light-emitting organic EL panel 100 is a so-called bottom emission type organic EL panel.

Figure 2:
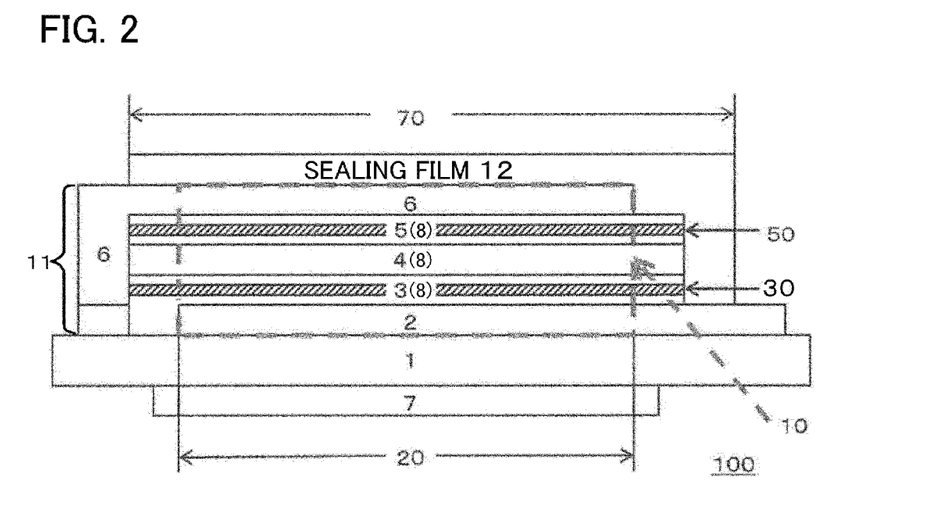
FIG. 2 is a schematic sectional view showing an organic EL element 10 in accordance with one embodiment of the present invention.

The white light-emitting organic EL panel 100 is prepared by laminating a multilayer film 11 in which an organic EL element 10 is included as a component thereof on a translucent insulation substrate 1, and the organic EL element 10 is sealed with a sealing film 12.

The multilayer film 11 includes a translucent anode electrode 2 (anode layer), an anode side blue light-emitting unit 3, a connection layer 4, a cathode side red-green light-emitting unit 5 and a cathode electrode 6 (cathode layer) which are arranged in this order from the translucent insulation substrate 1 side. The organic EL element 10 is a portion composed of the translucent anode electrode 2, the anode side blue light-emitting unit 3, the connection layer 4, the cathode side red-green light-emitting unit 5, and the cathode electrode 6, which are superimposed when planarly viewed. Considering from a different point of view, the organic EL element 10 is prepared by sandwiching a light-emitting functional layer 8 between the translucent anode electrode 2 and the cathode electrode 6, and the light-emitting functional layer 8 is a laminate composed of the anode side blue light-emitting unit 3, the connection layer 4, and the cathode side red-green light-emitting unit 5.

The organic EL element 10 belongs to a light-emitting region 20 and coincides with the light-emitting region 20 when planarly viewed.

The white light-emitting organic EL panel 100 has a light-emitting region 20 on the light-emitting surface thereof corresponding to the organic EL element 10.

Like the white light-emitting organic EL panel 100 in accordance with the present embodiment, in the case where a panel has a plurality of rated luminance values L1, L2 and the like at one rated color temperature, it is preferred that the panel be provided with a sealed region 70 covering the light-emitting region 20 when planarly viewed at the rear surface side thereof. That is, it is preferred that the white light-emitting organic EL panel 100 be provided with a sealed region 70 overlapped with the light-emitting region 20 when planarly viewed.

Thus, the occurrence of the dark spot (hereinafter, also referred to as DS) associated with a temperature rise of the organic EL element 10 at the time of being used at high luminance and the shortening of the life thereof can be prevented.

The sealing film 12 is a sealing layer forming the sealed region 70 and includes an inorganic sealing layer brought into contact with the organic EL element 10.

It is preferred that the average thickness of the sealing film 12 be greater than or equal to 1 μm and less than or equal to 10 μm.

Thus, the panel can be prevented from suddenly suffering from lighting failure while being used to emit light.

It is preferred that the sealing film 12 include the inorganic sealing layer and an adhesive layer brought into contact with the inorganic sealing layer. It is more preferred that the sealing film 12 further have a heat equalizing film, an outer packaging film and the like on the adhesive layer.

As described above, by adopting the sealing structure by means of a film instead of the sealing structure by means of a glass-made can as its sealing structure, the sealing performance is heightened, and the stability effect attained by making the green color phosphorescent material shift to the red side can be sufficiently exerted.

(Organic EL Element 10)

The organic EL element 10 has a layered structure constituted of a translucent anode electrode 2, an anode side blue light-emitting unit 3, a connection layer 4, a cathode side red-green light-emitting unit 5, and a cathode electrode 6, which are layered in this order from the translucent insulation substrate 1 side. That is, the organic EL element 10 is provided with a light-emitting functional layer 8 constituted of the anode side blue light-emitting unit 3, the connection layer 4 and the cathode side red-green light-emitting unit 5 between the translucent anode electrode 2 and the cathode electrode 6.

Each of the anode side blue light-emitting unit 3 and the cathode side red-green light-emitting unit 5 is a light-emitting unit.

The anode side blue light-emitting unit 3 is positioned at the more translucent anode electrode 2 side than the connection layer 4 when cross-sectionally viewed.

The anode side blue light-emitting unit 3 may be a unit which emits light of any color other than blue as a whole as long as the unit has a light-emitting layer emitting light of blue color.

The cathode side red-green light-emitting unit 5 is positioned at the more cathode electrode 6 side than the connection layer 4 when cross-sectionally viewed.

As long as the cathode side red-green light-emitting unit 5 has a red-green phosphorescent light-emitting layer 50 emitting phosphorescent light of red color and phosphorescent light of green color, the cathode side red-green light-emitting unit 5 may have an additional light-emitting layer, but it is preferred that the cathode side red-green light-emitting unit 5 have only the red-green phosphorescent light-emitting layer 50 as the light-emitting layer.

Moreover, as long as the organic EL element 10 includes the anode side blue light-emitting unit 3 and the cathode side red-green light-emitting unit 5, the organic EL element 10 can include an additional light-emitting unit together with an additional connection layer other than the connection layer 4. That is, as long as the organic EL element 10 has the layered structure prepared by sandwiching the connection layer 4 between the anode side blue light-emitting unit 3 and the cathode side red-green light-emitting unit 5, the organic EL element 10 may be provided with an additional light-emitting unit and an additional connection layer.

(Light-emitting Unit)

A light-emitting unit is constituted of a plurality of layers composed mainly of an organic compound. As such an organic compound, known compounds such as a low-molecular coloring material and a conjugated polymer material which are generally used for an organic EL element can be used.

Moreover, as long as the light-emitting unit described above has a light-emitting layer that emits light actually in the layer itself, the light-emitting unit can include a plurality of layers such as a hole injection layer, a hole transport layer, an electron transport layer, and an electron injection layer other than the light-emitting layer. These layers other than the light-emitting layer have a function of promoting the light emission mainly in the light-emitting layer.

In this context, the hole injection layer and the electron injection layer can be substituted with a hole injecting surface layer or an electron injecting surface layer of a connection layer described below, respectively.

Moreover, these layers can be formed appropriately by a known method such as a vacuum vapor deposition method, a sputtering method, a CVD method, a dipping method, a roll coating method (printing method), a spin coating method, a bar coating method, a spraying method, a die coating method and a flow coating method. From the viewpoint of preparing a high-performance element, it is preferred that these layers be formed by a vacuum vapor deposition method.

(Translucent Insulation Substrate 1)

The translucent insulation substrate 1 is a member which is in a planarly spread state and is composed of a translucent insulation material.

As the translucent insulation substrate 1, a glass substrate, a resin film substrate or the like can be used. As the translucent insulation substrate 1, from the viewpoint of suppressing the intrusion of moisture into the organic EL element 10, causing the lowering in performance, a glass substrate is preferred. Moreover, as the translucent insulation substrate 1, a flexible substrate can also be adopted.

(Translucent Anode Electrode 2)

The translucent anode electrode 2 is an anode layer which has a translucency and a conductivity, and functions as an anode.

As the material for the translucent anode electrode 2, transparent conductive metal oxides such as indium tin oxide (ITO), indium zinc oxide (IZO), stannic oxide ($SnO_2$) and zinc oxide (ZnO) can be adopted, and from the viewpoint of preparing a high-performance element, ITO or IZO which has high transparency is preferred.

(Anode Side Blue Light-Emitting Unit 3)

The anode side blue light-emitting unit 3 has a blue light-emitting layer 30 emitting light of at least blue color. It is preferred that the anode side blue light-emitting unit 3 include a hole injection layer, a hole transport layer, a blue light-emitting layer 30, an electron transport layer, and an electron injection layer, which are arranged in this order from the translucent anode electrode 2 side.

From the viewpoint of being made to have a prolonged life as compared with the case of using a blue color phosphorescent material, it is preferred that the blue light-emitting layer 30 be a blue fluorescent light-emitting layer including a blue color fluorescent material.

It is preferred that the blue light-emitting layer 30 have an emission peak within the range of 470 nm or less, it is more preferred that the blue light-emitting layer 30 have an emission peak within the range of 455 nm or more and 470 nm or less, and it is further preferred that the blue light-emitting layer 30 have an emission peak with a half-value width of 50 nm or more.

With regard to the blue light-emitting layer 30 in the present embodiment, the peak wavelength is greater than or equal to 455 nm and less than or equal to 470 nm, and the blue light-emitting layer 30 has an emission peak with a half-value width of 50 nm or more. In short, the blue light-emitting layer 30 in the present embodiment mainly has an emission peak corresponding to the third emission peak of the white light mentioned above.

(Connection Layer 4)

The connection layer 4 is a layer having a function of injecting electrons into the anode side blue light-emitting unit 3 side and injecting holes into the cathode side red-green light-emitting unit 5 side when current is applied to the organic EL element 10. As long as the connection layer 4 has such a function, various kinds of materials such as organic materials can be used for the connection layer 4. Moreover, various kinds of materials can also be used in combination.

With regard to the connection layer 4, from the viewpoint of enhancing the transparency thereof to attain the enhancement in luminance and the viewpoint of enhancing the injecting performance thereof for the respective electric charges to attain the enhancement in electrical properties, it is preferred that injection layers for the respective electric charges be used in combination.

It is more preferred that the connection layer 4 be a layer prepared by doping an electron-accepting or electron-donating dopant into each of transporting materials for the respective electric charges to which the dopant corresponds. For example, the connection layer 4 can be made to have a constitution obtained by laminating a hole injection layer prepared by doping an electron-accepting dopant into a hole transporting material and an electron injection layer prepared by doping an electron-donating dopant into an electron transporting material. The connection layer can also be constituted only of organic materials.

(Cathode Side Red-green Light-emitting Unit 5)

The cathode side red-green light-emitting unit 5 has at least a red-green phosphorescent light-emitting layer 50.

It is preferred that the cathode side red-green light-emitting unit 5 include a hole injection layer, a hole transport layer, a red-green phosphorescent light-emitting layer 50, an electron transport layer and an electron injection layer which are arranged in this order from the connection layer 4 side (translucent anode electrode 2) toward the cathode electrode 6 side.

(Red-green Phosphorescent Light-emitting Layer 50)

The red-green phosphorescent light-emitting layer 50 is a light-emitting layer which emits light of red color and light of green color, and includes a red color phosphorescent material, a green color phosphorescent material and a host material for the phosphorescent light-emitting layer. That is, the red-green phosphorescent light-emitting layer 50 is a light-emitting layer having at least a red color component and a green color component as the emission color.

It is preferred that the red-green phosphorescent light-emitting layer 50 be a homogenized monolayer including a red color phosphorescent material, a green color phosphorescent material, and a host material for the phosphorescent light-emitting layer.

The red-green phosphorescent light-emitting layer 50 is a co-vapor deposited layer formed by performing co-vapor deposition of a red color phosphorescent material, a green color phosphorescent material, and a host material for the phosphorescent light-emitting layer, and is a composite layer in which a red color phosphorescent material, a green color phosphorescent material and a host material for the phosphorescent light-emitting layer are combined.

The red-green phosphorescent light-emitting layer 50 is provided with an emission peak within the wavelength range of 500 nm or more and 580 nm or less and an emission peak within the wavelength range of 590 nm or more and 630 nm or less. That is, the red-green phosphorescent light-emitting layer 50 mainly has emission peaks corresponding to the first emission peak and the second emission peak of the white light mentioned above.

From the viewpoint of preparing a panel with high color rendering properties, the maximum emission peak wavelength of the red color phosphorescent material is apart from the maximum emission peak wavelength of the green color phosphorescent material by 60 nm or more.

Figure 4:
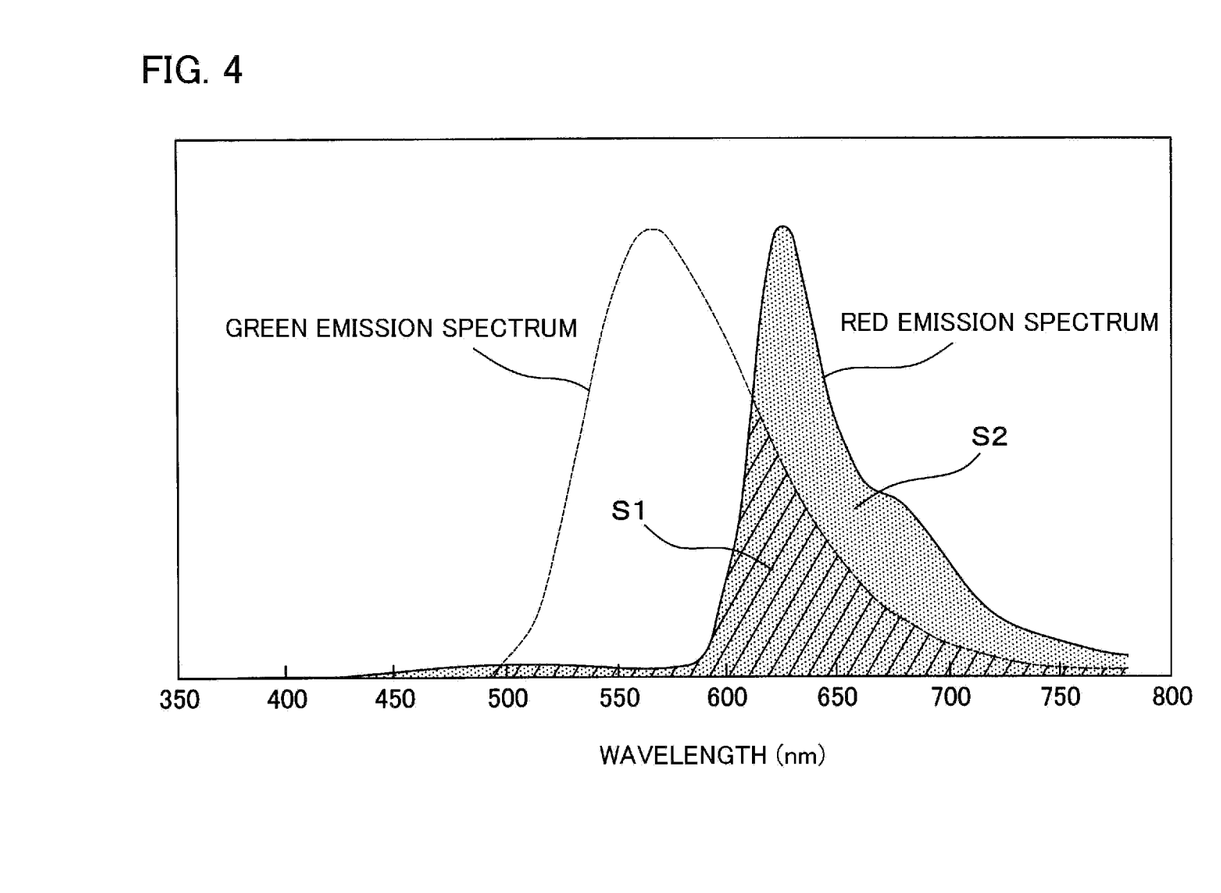
FIG. 4 is an explanatory diagram prepared by normalized emission spectra of light emitted only from a red color phosphorescent material and light emitted only from a green color phosphorescent material.

With regard to the red-green phosphorescent light-emitting layer 50, in the case where respective independent emission spectra of the red color phosphorescent material and the green color phosphorescent material are normalized, as shown in FIG. 4, normalized spectra of these materials are overlapped.

And then, the area S1 of an overlap of the normalized spectrum of the red color phosphorescent material and the normalized spectrum of the green color phosphorescent material is less than or equal to 60% of the area S2 of the normalized spectrum of the red color phosphorescent material, and from the viewpoint of attaining higher color rendering properties, it is more preferred that the area S1 be less than or equal to 50% of the area S2.

That is, the area of an overlap of the emission spectrum of the red color phosphorescent material and the emission spectrum of the green color phosphorescent material is less than or equal to 60%, more preferably less than or equal to 50%, of the whole area of the emission spectrum of the red color phosphorescent material.

With regard to the host material for the phosphorescent light-emitting layer, from the viewpoint of enhancing the red monochromatic light-emission by red shift, it is preferred that the energy gap $\Delta E$ between the $E_{LUMO}$ and the $E_{HOMO}$ thereof be greater than or equal to 2.5 eV and less than or equal to 3.5 eV.

From the viewpoint of enhancing the red monochromatic light-emission by red shift, when the content of the red color phosphorescent material in the red-green phosphorescent light-emitting layer 50 is defined as X mass %, it is preferred that X be greater than or equal to 0.01 and less than 0.3. That is, it is preferred that the content of the red color phosphorescent material be greater than or equal to 0.01 mass % and less than 0.3 mass % in the red-green phosphorescent light-emitting layer 50.

From the viewpoint of enhancing the red monochromatic light-emission by red shift, when the content of the green color phosphorescent material in the red-green phosphorescent light-emitting layer 50 is defined as (α×X) mass %, it is preferred that α be greater than or equal to 100 and less than 300. That is, it is preferred that the red-green phosphorescent light-emitting layer 50 include the green color phosphorescent material in an amount greater than or equal to 100 times and less than 300 times the amount of the red color phosphorescent material.

(Cathode Electrode 6)

The cathode electrode 6 is a cathode layer which has a conductivity, and functions as a cathode.

The cathode electrode 6 is a conductive thin film layer producible from a conductive material easy to become a thin film-like shape.

From the viewpoint of making the white light-emitting organic EL panel 100 a high-luminance panel, it is preferred that the cathode electrode 6 be a light reflecting thin film layer.

The cathode electrode 6 can be formed of various metallic materials.

From the viewpoint of making the cathode electrode 6 reflect light emitted from the light-emitting layer 30 or 50 toward the translucent insulation substrate 1 side to enhance the light extraction efficiency, metals with a white luster are preferred, and of these, silver (Ag) and aluminum (Al) are more preferred.

(Light Extraction Layer 7)

With regard to the white light-emitting organic EL panel 100, from the viewpoint of enhancing the luminance, the color, and the angle-dependent optical characteristics, as shown in FIG. 2, it is preferred that a light extraction layer 7 be provided at the outermost surface of a region at the light-emitting surface side including at least the light-emitting region 20. For example, with regard to the white light-emitting organic EL panel 100, it is preferred that the light extraction layer 7 be provided at the light exiting side of a glass substrate.

Examples of a method for forming the light extraction layer 7 include a nanoimprinting method of applying a resin composed of an acrylic resin and the like on the surface of a glass substrate as the translucent insulation substrate 1 and a method of subjecting a resin containing glass beads to spray-coating or slit-coating.

With regard to the method for forming the light extraction layer 7, it is preferred that a resin film (optical film) having one surface with a minute recess/protrusion structure and the other surface to which an adhesive material is stuck be attached to a surface at the light-emitting surface side of a glass substrate as the translucent insulation substrate 1 so as to make the one surface become the outermost surface mentioned above. That is, it is preferred that the light extraction layer 7 have minute recesses and protrusions formed on a surface at the opposite side to the translucent insulation substrate 1.

It is preferred that such an optical film constituting the light extraction layer 7 have light scattering properties.

It is preferred that attaching an optical film constituting the light extraction layer 7 to the translucent insulation substrate 1 be performed after an organic EL element 10 is formed so as not to allow the film surface to suffer from scratches.

Hereinafter, respective layers and materials constituting the white light-emitting organic EL panel 100 will be described in detail.

With regard to the white light-emitting organic EL panel 100 in accordance with the present embodiment, the organic EL element 10 is provided with the layered structure of a translucent anode electrode 2/a hole injection layer/a hole transport layer/a blue light-emitting layer 30/an electron transport layer/a connection layer 4/a hole transport layer/a red-green phosphorescent light-emitting layer 50/an electron transport layer/an electron injection layer/a cathode electrode 6. Moreover, the connection layer 4 includes an electron injecting surface layer arranged at the blue light-emitting layer 30 side and a hole injecting surface layer arranged at the red-green phosphorescent light-emitting layer 50 side.

(Hole Injection Layer)

Examples of the hole injection layer include a layer taking in holes from the translucent anode electrode 2 (positive electrode) side and injecting holes into a hole transport layer.

As the material for the hole injection layer, for example, a arylamine, a kind of phthalocyanine, oxides such as vanadium oxide, molybdenum oxide, ruthenium oxide, aluminum oxide and titanium oxide; amorphous carbon; conductive polymers such as polyaniline, polythiophene, polyphenylene vinylene, and a derivative thereof; and the like can be adopted.

Moreover, as the material for the hole injection layer, from the viewpoint of enhancing the transparency of the hole injection layer to enhance the luminance, a material prepared by doping an electron-accepting dopant into a hole transporting material can also be preferably adopted. In this case, it is preferred that the average thickness of the hole injection layer be greater than or equal to 0.1 nm and less than or equal to 20 nm.

(Hole Transport Layer)

The hole transport layer is a layer restricting the movement of electrons to the positive electrode side while effectively transporting holes from a hole injection layer side to the light-emitting layer 30 or 50.

As the material for the hole transport layer, a known hole transporting material can be used.

It is preferred that the average thickness of the hole transport layer be greater than or equal to 1 nm and less than or equal to 200 nm.

(Light-emitting Layer)

Each light-emitting layer is a layer prepared by doping a luminescent material into a host material having a hole transporting property or an electron transporting property, and is a layer in which the hole flowing thereinto from a hole transport layer and the electron flowing thereinto from an electron transport layer are combined by the electric field application to generate a light-emitting exciton.

It is preferred that the thickness of each light-emitting layer be greater than or equal to 1 nm and less than or equal to 40 nm.

(Electron Transport Layer)

The electron transport layer is a layer restricting the movement of electrons to the cathode electrode 6 (negative electrode) side while effectively transporting electrons from an electron injection layer side to the light-emitting layer 30 or 50.

As the material for the electron transport layer, a known electron transporting material can be used, and it is preferred that the average thickness thereof be greater than or equal to 1 nm and less than or equal to 200 nm.

(Electron Injection Layer)

Examples of the electron injection layer include a layer taking in electrons from the cathode electrode 6 (negative electrode) side and injecting electrons into an electron transport layer.

As the material for the electron injection layer, for example, lithium (Li), compounds of an alkali metal or an alkaline earth metal such as lithium fluoride (LiF), cesium fluoride (CsF) and calcium fluoride ($CaF_2$), and the like can be adopted.

Moreover, as the material for the electron injection layer, from the viewpoint of enhancing the transparency of the electron injection layer to enhance the luminance, a material prepared by doping an electron-donating dopant into an electron transporting material can also be preferably adopted.

It is preferred that the average thickness of the electron injection layer be greater than or equal to 0.1 nm and less than or equal to 20 nm.

(Hole Transporting Material)

As the hole transporting material, for example, a triphenylamine-based compound, a carbazole-based compound, and the like can be adopted.

Examples of the triphenylamine-based compound include N,N'-bis(3-methylphenyl)-(1,1'-biphenyl)-4,4'-diamine (TPD), 4,4'-bis[N-(naphthyl)-N-phenyl-amino]biphenyl (α-NPD), 4,4',4"-tris(N-(3-methylphenyl)N-phenylamino) triphenylamine (MTDATA), 4,4',4"-tris[N,N-(2-naphthyl)phenylamino]triphenylamine (2-TNATA), and the like.

Examples of the carbazole-based compound include 4,4'-N,N'-dicarbazole-biphenyl (CBP), 4,4',4"-tri(N-carbazolyl) triphenylamine (TCTA), 4,4'-N,N'-dicarbazole-2,2'-dimethylbiphenyl (CDBP), and the like.

(Electron Transporting Material)

As the electron transporting material, for example, a quinolinolato-based metal complex, an anthracene-based compound, an oxadiazole-based compound, a triazole-based compound, a phenanthroline-based compound, a silole-based compound, and the like can be adopted.

Examples of the quinolinolato-based metal complex include tris(8-quinolinolato)aluminum (Alq3), bis(2-methyl-8-quinolinolato)(p-phenyl phenolato)aluminum (BAlq), and the like.

Examples of the anthracene-based compound include 3-t-butyl-9,10-di(2-naphthyl)anthracene (TBADN), 9,10-di (2-naphthyl)anthracene (ADN), and the like.

Examples of the oxadiazole-based compound include 1,3-bis[(4-t-butylphenyl)-1,3,4-oxadiazole]phenylene (OXD-7), 2-(4-biphenylyl)-5-(4-t-butylphenyl)-1,3,4-oxadiazole (PBD), 1,3,5-tris(4-t-butylphenyl-1,3,4-oxadiazolyl) benzene (TPOB), and the like.

Examples of the triazole-based compound include 3-phenyl-4-(1'-naphthyl)-5-phenyl-1,2,4-triazole (TAZ), and the like.

Examples of the phenanthroline-based compound include bathophenanthroline (Bphen), bathocuproine (BCP), and the like.

Examples of the silole-based compound include 2, 5-di-(3-biphenyl)-1,1-dimethyl-3,4-diphenyl silacyclopentadiene (PPSPP), 1,2-bis(1-methyl-2,3,4,5-tetraphenylsilacyclopentadienyl)ethane (2PSP), 2,5-bis-(2,2-bipyridine-6-yl)-1,1-dimethyl-3,4-diphenyl silacyclopentadiene (PyPySPyPy), and the like.

(Luminescent Material)

Luminescent materials constituting each light-emitting layer are classified into a fluorescent material and a phosphorescent material which is generally higher in luminous efficiency than the former.

As a red color-based fluorescent light-emitting material, rubrene, DCM, DCM2, DBzR, and the like can be adopted.

As a green color-based fluorescent light-emitting material, coumarin 6, C545T, and the like can be adopted.

As a blue color-based fluorescent light-emitting material, perylene 4,4'-bis(9-ethyl-3-carbazovinylene)-1,1-biphenyl (BCzVBi), 4,4'-bis[4-(di-p-triamino)styryl]biphenyl (DPAVBi), and the like can be adopted.

As a red color-based phosphorescent light-emitting material, (bzq)2Ir(acac), (btp)2Ir(acac), Ir(bzq)3, and Ir(piq)3 which are iridium complexes, and the like can be adopted.

As a green color-based phosphorescent light-emitting material, (ppy)2Ir(acac) and Ir(ppy)3 which are iridium complexes, and the like can be adopted.

As a blue color-based phosphorescent light-emitting material, FIrpic, FIr6 and Ir(Fppy)3 which are iridium complexes, and the like can be adopted.

(Electron-accepting Dopant)

As an electron-accepting dopant, a tetracyanoquinodimethane-based compound, molybdenum oxide ($MoO_3$), tungsten oxide ($WO_3$), vanadium oxide ($V_2O_5$), and the like can be adopted.

Examples of the tetracyanoquinodimethane-based compound include tetracyanoquinodimethane (TCNQ), 2,3,5,6-tetrafluoro-7,7,8,8-tetracyanoquinodimethane (F4-TCNQ), and the like.

(Electron-Donating Dopant)

As an electron-donating dopant, an alkali metal, an alkaline earth metal, a rare earth metal, a compound of these metals, a phthalocyanine complex making any of these metals the central metal, a dihydroimidazole compound, and the like can be adopted.

Examples of the alkali metal include lithium (Li), sodium (Na), potassium (K), rubidium (Rb), cesium (Cs), and the like.

Examples of the alkaline earth metal include magnesium (Mg), calcium (Ca), strontium (Sr), barium (Ba), and the like.

Examples of the dihydroimidazole compound include bis-[1,3-diethyl-2-methyl-1,2-dihydrobenzimidazolyl]tetrathiafulvalene (TTF), tetrathianaphthacene (TTT), and the like.

According to the white light-emitting organic EL panel 100 of the present embodiment, since the cathode side red-green light-emitting unit 5 is provided with the red-green phosphorescent light-emitting layer 50 in which a red color phosphorescent material and a green color phosphorescent material are combined with a host material for the phosphorescent light-emitting layer, in the red-green phosphorescent light-emitting layer 50, the red shift attributed to the green color phosphorescent material can be made to stably occur. As such, the ratio of the green emission and the red emission can be kept constant regardless of the temperature of the organic EL element 10 and the current density, and a widely ranging emission spectrum from red color close to natural light can be obtained.

According to the white light-emitting organic EL panel 100 of the present embodiment, the red-green phosphorescent light-emitting layer 50 is easily formed because the red-green phosphorescent light-emitting layer 50 in the cathode side red-green light-emitting unit 5 is formed by subjecting a host material for the phosphorescent light-emitting layer, a red color phosphorescent material and a green color phosphorescent material to co-vapor deposition.

In the embodiment mentioned above, the white light-emitting organic EL panel 100 is a bottom emission type organic EL panel in which white light is taken out from the translucent insulation substrate 1 side, but the present invention is not limited thereto. The white light-emitting organic EL panel may be a top emission type organic EL panel in which white light is taken out from the opposite side to the substrate.

In the embodiment mentioned above, a resultant light composed of two kinds of light emitted from two light-emitting units of the anode side blue light-emitting unit 3 and the cathode side red-green light-emitting unit 5 is used to generate white light, but the present invention is not limited thereto. A resultant light composed of three or more kinds of light emitted from three or more light-emitting units may be used to generate white light.

In the embodiment mentioned above, each of the light-emitting units 3, 5 is provided with a hole injection layer, an electron injection layer and the like, but the present invention is not limited thereto. Each of the light-emitting units 3, 5 needs only to be provided with at least a light-emitting layer. For example, like the example described below, an organic EL element 10 may have a layered structure with a stack of a translucent anode electrode 2/a hole transport layer/a blue light-emitting layer 30/an electron transport layer/a connection layer 4/a hole transport layer/a red-green phosphorescent light-emitting layer 50/an electron transport layer/an electron injection layer/a cathode electrode 6.

EXAMPLES

Hereinafter, the present invention will be described in detail by reference to examples. In this connection, the present invention is not limited to the following examples and can be appropriately changed to be implemented without changing the gist thereof.

Example 1

In Example 1, a white light-emitting organic EL panel 100 shown in FIG. 1 and FIG. 2 was prepared.

Specifically, a substrate in which an ITO layer with a thickness of 120 nm was formed on a glass substrate with outline dimensions of 80 mm×80 mm and a thickness of 0.7 mm was prepared. On this substrate, a multilayer film 11 was formed according to the following procedure to form an organic EL element 10 having a light-emitting region 20 of 70.2 mm×70.2 mm. Afterward, a sealing film 12 was formed so that the light-emitting region 20 is contained therein when planarly viewed to form a sealed region 70. Moreover, by a process performed separately, an optical film (OCF film) as a light extraction layer 7 was attached to the front surface side of the substrate to prepare a white light-emitting organic EL panel 100.

Specifically, an ITO layer was firstly formed on a glass substrate, the ITO layer on the glass substrate was patterned by a wet etching method to form a translucent anode electrode 2 and other portions, and a substrate for forming an organic EL element was prepared.

Figure 5:
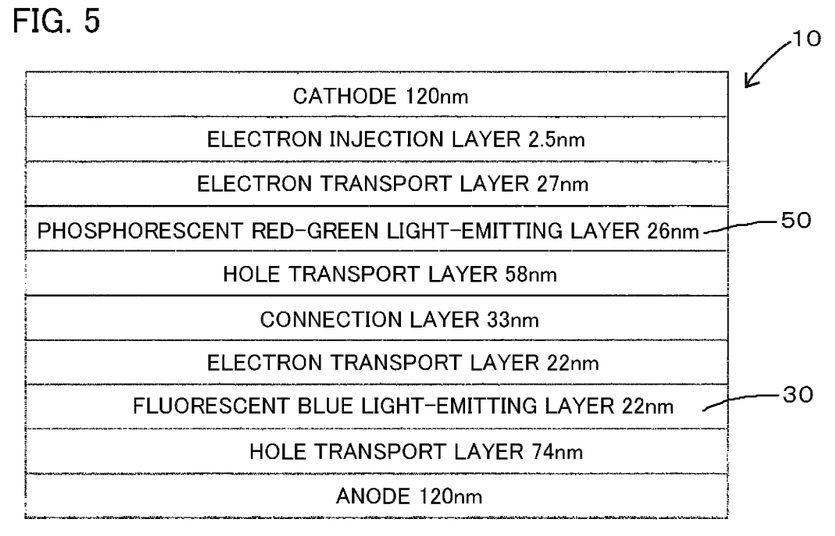
FIG. 5 is a sectional configuration diagram of an organic EL element 10 of Example 1.

Next, as shown in FIG. 5, on this substrate for the organic EL light-emitting element, layers were deposited by a vacuum vapor deposition method using a prescribed mask, and a metal cathode layer composed of aluminum (Al) was deposited thereon by a vacuum vapor deposition method using a prescribed mask to form an organic EL element 10.

In this connection, FIG. 5 is a sectional configuration diagram of the organic EL element 10 of Example 1.

Specifically, a vacuum vapor deposition was performed at a deposition rate of about 0.1 nm/sec under vacuum at a degree of vacuum of $1 \times 10^{-4}$ Pa or more so that the film thickness-configuration of the respective layers shown in FIG. 5 is attained. With regard to a layer composed of two or more materials such as a light-emitting layer, the materials were subjected to co-vapor deposition at a prescribed mixing ratio. Afterward, a cathode electrode 6 as a cathode was deposited at a rate of 0.1 to 0.3 nm/sec under vacuum.

Next, on this organic EL element 10, a silicon nitride film with an average thickness of 2 μm was formed by a CVD method using a prescribed mask, subsequently, polysilazane was applied thereon by a spraying method, and the film was fired to form a silica conversion layer (a silica layer obtained through conversion) as an inorganic sealing layer with an average thickness of 2 μm. Furthermore, onto the organic EL element 10 sealed with this inorganic sealing layer, a protective film composed of PET (Poly(ethylene terephthalate)) with an adhesive material was attached to form a sealed region 70.

Finally, an optical film (OCF film) was attached to a surface at the opposite side to the surface of the glass substrate on which the organic EL element 10 was formed to prepare a white light-emitting organic EL panel 100 of Example 1.

In this context, with regard to the white light-emitting organic EL panel 100 of Example 1, as shown in FIG. 5, the average thickness of a fluorescent blue light-emitting layer which is a blue light-emitting layer 30 was determined to be 22 nm and the average thickness of a phosphorescent red-green light-emitting layer which is a red-green phosphorescent light-emitting layer 50 was determined to be 26 nm.

For a red color phosphorescent material, a green color phosphorescent material and a host material for the phosphorescent light-emitting layer, which constitute a phosphorescent red-green light-emitting layer, the following materials were used, respectively.

Figure 7:
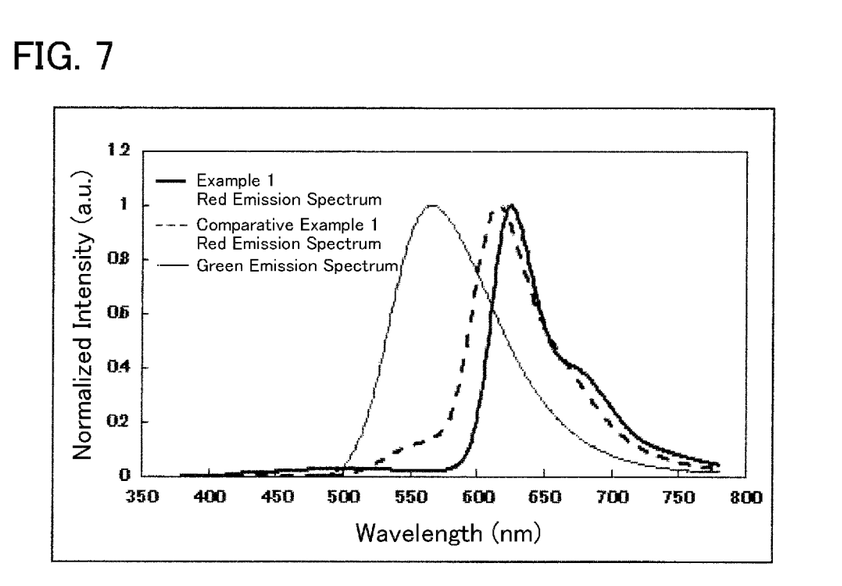
FIG. 7 shows normalized emission spectra which are obtained under the same current density and respectively represent the monochromatic structure of each of a red color phosphorescent material used in Example 1 or a red color phosphorescent material used in Comparative Example 1 and a green color phosphorescent material used together with these respective materials.

That is, as shown in FIG. 7, as the red color phosphorescent material, a material making the red emission spectrum thereof have a maximum emission peak wavelength of 625 nm was adopted. As the green color phosphorescent material, a material making the green emission spectrum thereof have a maximum emission peak wavelength of 560 nm was adopted. As the host material for the phosphorescent light-emitting layer, a material having an energy gap $\Delta E$ between the $E_{LUMO}$ and the $E_{HOMO}$ of 3.1 eV was adopted.

Moreover, the content of the red color phosphorescent material in the red-green phosphorescent light-emitting layer 50 was set to 0.25 mass % and the content of the green color phosphorescent material in the red-green phosphorescent light-emitting layer 50 was set to 20 mass %.

Furthermore, in each monochromatic light normalized spectrum, the area of an overlap of the red emission spectrum of the red color phosphorescent material and the green emission spectrum of the green color phosphorescent material was determined to be 51% of the area of the red emission spectrum.

Moreover, as a blue color fluorescent material constituting a fluorescent blue light-emitting layer, a material making the blue emission spectrum thereof have a maximum emission peak wavelength of 465 nm and making the monochromatic light normalized spectrum thereof have a half-value width of 60 nm was adopted.

Figure 6:
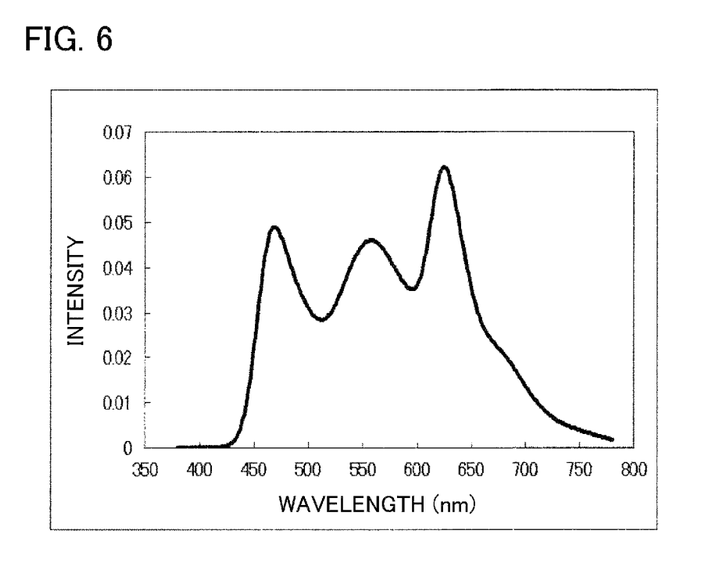
FIG. 6 shows an emission spectrum of a white light-emitting organic EL panel of Example 1.

A constant current of 4 mA/cm² was made to pass through the white light-emitting organic EL panel 100 thus obtained and the emitted light from the light-emitting region 20 was measured using a spectroradiometer CS-1000 (available from KONICA MINOLTA SENSING AMERICAS, INC.) to evaluate the chromaticity, the color rendering index and the emission spectrum. The white color emission spectrum is shown in FIG. 6.

The emitted light of the white light-emitting organic EL panel 100 was determined to have a color temperature of 4000 K, a luminance value of 3000 cd/m², an Ra value for color rendering properties of 92 and an R9 value therefor of 97. Moreover, with regard to the emitted light of the white light-emitting organic EL panel 100, the coordinate position in the CIE 1931 chromaticity coordinate system was determined to be at a distance of 0.004 from a black-body radiation curve.

And then, based on the results, it was confirmed whether, in the case where a rated color temperature of this panel is set to 4000 K and a rated luminance value with which the rated color temperature is attained is set to 3000 cd/m², another rated luminance value can be set to 300 cd/m² at a color temperature equal thereto or not.

As a result thereof, with regard to this panel, a rated luminance value of 3000 cd/m² was attained in the case where the rated current was set to 200 mA and a rated luminance value of 300 cd/m² was attained while maintaining a color temperature of 4000 K, which is equal to the color temperature thereof, in the case where the rated current was set to 20 mA. That is, in both cases where the rated current was set to 200 mA or 20 mA, basic hue values were determined to be the same as each other. It is thought that this is attributed to the high stability according to the present invention.

Comparative Example 1

A panel of Comparative Example 1 was prepared to be evaluated in the same manner as that in Example 1 except that a material having a maximum emission peak wavelength of 610 nm was adopted as the red color phosphorescent material.

That is, in Example 1, the maximum emission peak wavelength of the red color phosphorescent material and the maximum emission peak wavelength of the green color phosphorescent material are apart from each other by 65 nm, and in contrast, in Comparative Example 1, the distance therebetween is 50 nm.

Moreover, a material in which the area of an overlap of the red emission spectrum of the red color phosphorescent material and the green emission spectrum of the green color phosphorescent material is 61% of the area of the red emission spectrum in each monochromatic light normalized spectrum was used.

normalized emission spectra which are obtained under the same current density and respectively represent the monochromatic structure of each of a red color phosphorescent material used in Example 1, a red color phosphorescent material used in Comparative Example 1 and a green color phosphorescent material used together with these respective red color phosphorescent materials are shown in FIG. 7.

Comparative Example 2

A panel of Comparative Example 2 was prepared/evaluated in the same manner as that in Comparative Example 1 except that a material having a maximum emission peak wavelength of 451 nm was adopted as the blue color fluorescent material.

The chromaticity of each panel of Example 1 and Comparative Examples 1, 2, the general color rendering index Ra, the special color rendering index R9, the distance duv from a black-body radiation curve, and the red monochromatic emission spectrum/green monochromatic emission spectrum area ratio of luminescent materials of the red-green phosphorescent light-emitting layer 50 used in Example 1 and Comparative Example 1 are shown in Table 1.

That is, the general color rendering index Ra, the special color rendering index R9, the deviation duv from a black-body locus, and the area ratio of the area of an overlap of the red emission spectrum of the red color phosphorescent material and the green emission spectrum of the green color phosphorescent material to the area of the red emission spectrum are shown in Table 1.

TABLE 1

| | Blue peak wavelength (nm) | Red peak wavelength (nm) | Ratio of overlapping area to red emission spectrum area | Chromaticity (x, y) | Ra | R9 | duv |
|---|---|---|---|---|---|---|---|
| Example1 | 465 | 625 | 51% | (0.382, 0.386) | 92 | 97 | 0.004 |
| Comparative Example 1 | 465 | 610 | 61% | (0.382, 0.388) | 84 | 21 | 0.004 |
| Comparative Example 2 | 451 | 610 | | (0.382, 0.388) | 82 | 10 | 0.004 |

From the Table 1, by making the maximum emission peak wavelength of the red color phosphorescent material and the maximum emission peak wavelength of the green color phosphorescent material apart from each other by 60 nm or more to be adjusted so that spectra thereof are not overlapped, it was found that a high special color rendering index R9 as well as a high general color rendering index Ra is attained.

Example 2

A panel of Example 2 was prepared to be evaluated in the same manner as that in Example 1 except that film sealing by forming a sealing film by CVD method-film forming and the like was not performed and glass-made can sealing was performed.

The panel of Example 2 thus prepared was determined to be a panel capable of setting the rated luminance value to 300 cd/m² and setting the rated color temperature to 4000 K in the case of making a current of 20 mA as the rated current flow therethrough. In the case of making a current of 200 mA flow therethrough, the basic hue was determined to be white color, and this is the same as the case of 20 mA.

However, as a result of the quantitative research, the color temperature was changed from 4000 K by an amount of change in temperature greater than 500 K, and it was difficult for the rated luminance value of the panel at a color temperature equal thereto to be attained.

From the above, it was found that, by using a composite layer as the red-green phosphorescent light-emitting layer in which a red color phosphorescent material and a green color phosphorescent material are combined with a host material for the phosphorescent light-emitting layer and making the green color phosphorescent material shift to the red side, a high general color rendering index Ra and a high special color rendering index R9 are attained and the hue stability of a basic product is attained. Moreover, by being subjected to film sealing, the hue of a product mentioned above is further stabilized, and even in the case where the rated current is changed from a smaller rated current to a larger rated current, it has been possible to set the rated luminance value while maintaining a color temperature equal thereto.

EXPLANATION OF REFERENCE SIGNS

1: Translucent insulation substrate
2: Translucent anode electrode (anode layer)
3: Anode side blue light-emitting unit
4: Connection layer
5: Cathode side red-green light-emitting unit
6: Cathode electrode (cathode layer)
7: Light extraction layer
8: Light-emitting functional layer
10: Organic EL element
20: Light-emitting region
50: Red-green phosphorescent light-emitting layer
70: Sealed region
100: White light-emitting organic EL panel

The invention claimed is:
1. A white light-emitting organic EL panel comprising an organic EL element that includes:
   an anode layer;
   a cathode layer; and
   a light-emitting functional layer between the anode layer and the cathode layer,
      the light-emitting functional layer including in order from the anode layer toward the cathode layer: an anode side blue light-emitting unit; a connection layer; and a cathode side red-green light-emitting unit,
   the connection layer injecting electrons into the anode side blue light-emitting unit and injecting holes into the cathode side red-green light-emitting unit when current is applied,
   the cathode side red-green light-emitting unit including a red-green phosphorescent light-emitting layer that is a single composite layer including:
      a red color phosphorescent material;
      a green color phosphorescent material; and
      a host material for the phosphorescent light-emitting layer,
   wherein maximum emission peak wavelength of the red color phosphorescent material is apart from maximum emission peak wavelength of the green color phosphorescent material by 60 nm or more, and
   wherein the white light-emitting organic EL panel is capable of emitting white light with an general color rendering index Ra and a special color rendering index R9 in accordance with JIS Z 8726, both of the Ra and the R9 being greater than or equal to 90, wherein the white light has a rated color temperature within a range of 500 K or lower;
   wherein the organic EL element is laminated on a substrate;
   wherein the white light-emitting organic EL panel further comprises a sealing film that seals the organic EL element between the sealing film and the substrate, the sealing film including an inorganic sealing layer in contact with the organic EL element; and
   wherein at the rated color temperature, the white light-emitting organic EL panel is capable of being set to at least a first rated luminance value and a second rated luminance value, the two rated luminance values being allocated so as to have 2000 cd/m$^2$ in between, the second rated luminance value being greater than or equal to 2 times of the first rated luminance value.

2. The white light-emitting organic EL panel according to claim 1, wherein the host material for the phosphorescent light-emitting layer has an energy gap $\Delta E$ between $E_{LUMO}$ and $E_{HOMO}$ greater than or equal to 2.5 eV and less than or equal to 3.5 eV.

3. The white light-emitting organic EL panel according to claim 1, wherein an emission spectrum of the white light has an emission peak within the range of 500 nm to 580 nm and another emission peak within the range of 590 nm to 630 nm.

4. The white light-emitting organic EL panel according to claim 1, wherein a coordinate position of the white light in CIE 1931 chromaticity coordinate system is at a distance less than or equal to 0.005 from a black-body radiation curve.

5. The white light-emitting organic EL panel according to claim 1,
   wherein the color temperature of the white light is higher than or equal to 3000 K and lower than or equal to 5000 K, and
   wherein the white light has an emission peak within a range of 455 nm or more and 470 nm or less as its spectrum, the emission peak having a half-value width greater than or equal to 50 nm.

6. The white light-emitting organic EL panel according to claim 1, wherein an area on which the red emission spectrum of the red color phosphorescent material and the green emission spectrum of the green color phosphorescent material overlap is less than or equal to 60% of an area of the red emission spectrum.

7. A production method for the white light-emitting organic EL panel according to claim 1, comprising the step of:
   performing co-vapor deposition of the red color phosphorescent material, the green color phosphorescent material, and the host material for the phosphorescent light-emitting layer to form the red-green phosphorescent light-emitting layer.

8. A white light-emitting organic EL panel comprising an organic EL element that includes:
   an anode layer;
   a cathode layer; and
   a light-emitting functional layer between the anode layer and the cathode layer,
      the light-emitting functional layer including in order from the anode layer toward the cathode layer: an anode side blue light-emitting unit; a connection layer; and a cathode side red-green light-emitting unit,
   the connection layer injecting electrons into the anode side blue light-emitting unit and injecting holes into the cathode side red-green light-emitting unit when current is applied, the cathode side red-green light-emitting unit including a red-green phosphorescent light-emitting layer that is a single composite layer including:
a red color phosphorescent material;
a green color phosphorescent material; and
a host material for the phosphorescent light-emitting layer,
wherein maximum emission peak wavelength of the red color phosphorescent material is apart from maximum emission peak wavelength of the green color phosphorescent material by 60 nm or more, and
wherein the white light-emitting organic EL panel is capable of emitting white light with an general color rendering index Ra and a special color rendering index R9 in accordance with JIS Z 8726, both of the Ra and the R9 being greater than or equal to 90, wherein a color temperature of the white light is higher than or equal to 3000 K and lower than or equal to 5000 K, and wherein the white light has an emission peak within a range of 455 nm or more and 470 nm or less as its spectrum, the emission peak having a half-value width greater than or equal to 50 nm.

9. The white light-emitting organic EL panel according to claim 8,
wherein the organic EL element is laminated on a substrate, and
wherein the white light-emitting organic EL panel further comprises a sealing film that seals the organic EL element between the sealing film and the substrate, the sealing film including an inorganic sealing layer in contact with the organic EL element.

10. The white light-emitting organic EL panel according to claim 9,
wherein the white light has a rated color temperature within a range of 500 K or lower, and
wherein at the rated color temperature, the white light-emitting organic EL panel is capable of being set to at least a first rated luminance value and a second rated luminance value, the two rated luminance values being allocated so as to have 2000 cd/m$^2$ in between, the second rated luminance value being greater than or equal to 2 times of the first rated luminance value.

11. The white light-emitting organic EL panel according to claim 8, wherein the host material for the phosphorescent light-emitting layer has an energy gap ΔE between $E_{LUMO}$ and $E_{HOMO}$ greater than or equal to 2.5 eV and less than or equal to 3.5 eV.

12. The white light-emitting organic EL panel according to claim 8, wherein an emission spectrum of the white light has an emission peak within the range of 500 nm to 580 nm and another emission peak within the range of 590 nm to 630 nm.

13. The white light-emitting organic EL panel according to claim 8, wherein a coordinate position of the white light in CIE 1931 chromaticity coordinate system is at a distance less than or equal to 0.005 from a black-body radiation curve.

14. The white light-emitting organic EL panel according to claim 8, wherein an area on which the red emission spectrum of the red color phosphorescent material and the green emission spectrum of the green color phosphorescent material overlap is less than or equal to 60% of an area of the red emission spectrum.

15. A production method for the white light-emitting organic EL panel according to claim 8, comprising the step of:
performing co-vapor deposition of the red color phosphorescent material, the green color phosphorescent material, and the host material for the phosphorescent light-emitting layer to form the red-green phosphorescent light-emitting layer.

* * * * *